United States Patent
Lee et al.

(10) Patent No.: US 6,621,150 B1
(45) Date of Patent: Sep. 16, 2003

(54) LEAD FRAME ADAPTABLE TO THE TREND OF IC PACKAGING

(75) Inventors: Yvonne Lee, Taichung (TW); Chien-Ping Huang, Hsinchu (TW); Han-Ping Pu, Taipei (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/193,530

(22) Filed: Jul. 10, 2002

(51) Int. Cl.⁷ .............................................. H01L 23/495
(52) U.S. Cl. ...................... 257/666; 257/692; 257/735; 257/676; 257/690
(58) Field of Search ................................ 257/666, 667, 257/668, 691, 692, 735, 782, 784, 676, 674, 690, 694

(56) References Cited

U.S. PATENT DOCUMENTS

| | | | |
|---|---|---|---|
| 5,545,920 A | | 8/1996 | Russell |
| 5,872,398 A | | 2/1999 | King et al. |
| 6,107,675 A | * | 8/2000 | Sugimoto et al. ............ 257/666 |
| 6,297,545 B1 | * | 10/2001 | Sugiyama et al. ........... 257/666 |
| 6,445,061 B2 | * | 9/2002 | Corisis ......................... 257/666 |
| 6,476,468 B2 | * | 11/2002 | Corisis ......................... 257/666 |

* cited by examiner

*Primary Examiner*—Hoai Ho
*Assistant Examiner*—Andy Huynh
(74) *Attorney, Agent, or Firm*—Klarquist Sparkman, LLP

(57) ABSTRACT

Conventional configuration of a lead frame, particularly a lead frame in a Lead-on-Chip package, is substituted by one having inward ends of leads thereof arranged in unprecedented ways, resulting in bigger gap between any two adjacent inward ends of inner leads, leading to bigger Inner Lead Pitch of a lead frame in which the space available is inherently limited. It is by the new configuration that an IC packaging process can be immunized against the difficulty resulting from too small Inner Lead Pitch of a lead frame, and the bottle neck in the process of packaging an IC subject to the tendency of minimizing the size of an IC can thus be overcome.

33 Claims, 4 Drawing Sheets

LEAD FRAME ADAPTABLE TO THE TREND OF IC PACKAGING

FIELD OF THE INVENTION

The present invention relates to an art of configuring the leads of a Lead Frame used in packaging integrated circuits, particularly for LOC (Lead on Chip) packages.

BACKGROUND OF THE INVENTION

In conventional processes of packaging an IC (integrated circuit), a lead frame 1 as shown in FIG. 1 usually includes a plurality of leads separated into two groups respectively represented by reference numerals 11 and 12, the group represented by reference numeral 11 including a line of outward ends represented by reference numeral 13 and a line of inward ends represented by reference numeral 15, the group represented by reference numeral 12 including a line of outward ends represented by reference numeral 14 and a line of inward ends represented by reference numeral 16, the leads in the two groups stretching to the outside of the lead frame 1 in opposite directions. The two lines of inward ends 15 and 16, in order to match the size of an IC (under the lead frame 1, not shown in the figure), must be inside a quadrilateral region 17, and opposite to each other with a space 18 therebetween so that bonding wires 20 can be connected between bonding pad 100 of the IC and inward ends 15 or 16. As shown in FIG. 1, the two lines of inward ends 15 and 16 are inside a quadrilateral region 17 which is located in the central portion of lead frame 1, and are evenly dispersed between two parallel edges 171 and 173 of quadrilateral region 17 in two lines both perpendicular to the edges 171 and 173 while separated from each other by a distance 18. The distance 18 is to let bonding wire 20 pass therethrough so that the inward ends 15 and 16 can be connected to bonding pads 100 of an IC.

For more information about structures of a conventional lead frame used in Lead on Chip packages, reference to U.S. Pat. Nos. 5,545,920 and 5,872,398 shall be made.

To keep pace with the tendency of minimizing the size of an IC, the space available for accommodating leads 11 and 12 (also inward ends 15 an 16) in lead frame 1 is decreasing. For example, the pitch of bonding pads of an IC is reduced as a result of size reduction of the IC, and the pitch of leads as well as the gap 191 between adjacent inward ends of leads must be reduced accordingly, resulting in significant difficulty in packaging an IC subject to the tendency of minimizing the size of the IC, leading to higher failure rate and higher manufacturing cost. To respond to the tendency of minimizing the size of ICs (integrated circuits), the present invention provides schemes of changing the configuration of inward ends 15 and 16, so that the difficulty in the process of packaging ICs of smaller size arising from the requirement of smaller pitch of leads 11 or 12 (also smaller gap between adjacent inward ends 15 or 16) of a lead frame 1 can be avoided.

To keep pace with the tendency of increasing number of electrical connections with an IC, the space of a lead frame must be capable of accommodating more leads, resulting in significant difficulty in packaging an IC due to the inevitable reduction of inner lead pitch of a lead frame if size remains on the same scale, leading to higher failure rate and higher manufacturing cost. To respond to the tendency of requiring more electrical connections with an IC, the present invention provides schemes of changing the configuration of inward ends 15 and 16, so that the difficulty in the process of packaging an IC providing more electrical connections can be avoided.

SUMMARY OF THE INVENTION

An object of the present invention is to provide new configurations of a lead frame by which bigger inner lead pitches can be achieved without need of increasing the size of the lead frame, thereby the failure rate and manufacturing cost in the process of packaging ICs can be lowered, particularly the difficulty in packaging ICs of smaller size can be significantly eased.

Another object of the present invention is to immunize an IC packaging process against the difficulty resulting from smaller size of the lead frame or the IC to be packaged, or from larger number of leads/electrical connections of the lead frame or the IC to be packaged.

The present invention is characterized by arranging the inward ends of leads of a lead frame in unprecedented ways in order to realize bigger inner lead pitch (or bigger gap between adjacent inward ends) of a lead frame compared to a conventional one of equivalent size.

The word "IC" in this disclosure means "integrated circuit", and the word "ICs" means "integrated circuits".

What is represented by the words "lead frame" in this disclosure is not limited to the popularly known lead frame. The lead frame in this disclosure represents any means capable of providing or supporting electrical conduction between at least an IC in a package and any device outside the package. A bonding surface of an IC in this disclosure means a surface from which the IC is electrically connected. For example, a bonding surface of an IC in the form of a chip is a surface having bonding pads thereon for electrical connection with the IC. What is represented by the word "disperse" in this disclosure includes the meaning of "be disposed".

A first aspect of the present invention may be represented by a lead frame for a process of packaging at least an IC, which comprises: a first group of leads; a second group of leads; and an IC corresponding region enclosed by a polygon (a quadrilateral corresponding to the pattern of an IC, or equivalent to the size or shape of a bonding surface of an IC, for example); wherein the lead includes at least an outward end and an inward end, the inward end being inside the IC corresponding region, the inward ends of the first group of leads facing and being spaced from the inward ends of the second group of leads; and wherein the first edge of the polygon is perpendicular to the second edge of the polygon, the third edge of the polygon parallels the first edge of the polygon, the inward ends disperse one by one between the first edge of the polygon and the third edge of the polygon (i.e., disperse one by one from the first edge of the polygon to the third edge of the polygon, or from the third edge of the polygon to the first edge of the polygon) in such a way that the further an arbitrary one of the inward ends is from the first edge of the polygon than another one of the inward ends, the nearer the arbitrary one of the inward ends is from the second edge of the polygon than the another one of the inward ends.

It can be seen the gap between any adjacent two of the inward ends of leads of either the first group or the second group in the lead frame according to the first aspect of the present invention can be significantly bigger than a corresponding gap (191 in FIG. 1) in a conventional lead frame of the same size scale, and the inner lead pitch of leads of either the first group or the second group according to the present invention can thus be significantly bigger. It is obvious the inner lead pitch of any two arbitrary leads of either the first group or the second group can be bigger than or at least equal to the gap between the inward ends of the two arbitrary leads.

If used in LOC packages, the inward ends of the first group of leads in the lead frame according to the first aspect of the present invention are spaced from those of the second group of leads by distances adequate for making electrical connection between the IC and the leads of the lead frame. For example, the bonding wires connecting the bonding pads of the IC and the leads of the lead frame must pass the space between the inward ends of the first group of leads and those of the second group of leads, therefore the distances between the inward ends of the first group of leads and those of the second group of leads are usually adequate for the bonding wires to be connected between the inward ends of the leads and the bonding pads of the IC. The distances between the inward ends of the first group of leads and those of the second group of leads may be uniform or vary with the locations of the inward ends, subject to the only condition that the space between the inward ends of the first group of leads and those of the second group of leads is adequate for electrically connecting therethrough the IC and the leads.

In the lead frame according to the first aspect of the present invention, the first group of leads may stretch to the outside of the lead frame in a first direction, and the second group of leads may stretch to the outside of the lead frame in a second direction different from or opposite to the first direction.

In the lead frame according to the first aspect of the present invention, the inward ends of the first group of leads may disperse along a first straight line, and the inward ends of the second group of leads may disperse along a second straight line either paralleling or not paralleling the first straight line. However, in the lead frame according to the first aspect of the present invention, the inward ends of the first group of leads do not necessarily disperse along a straight line, neither do the inward ends of the second group of leads necessarily disperse along a straight line.

In the lead frame according to the first aspect of the present invention, the IC corresponding region may be a plane matching the pattern of the IC or a bonding surface of the IC.

A second aspect of the present invention may be represented by a lead frame for a process of packaging at least an IC, which comprises: a first group of leads; a second group of leads; and an IC corresponding region (a 3-dimensional space) enclosed by a hexahedron which, for example, has a bottom surface corresponding to a bonding surface of an IC, and is rather small in height; wherein the lead includes at least an outward end and an inward end, the inward ends being inside the IC corresponding region, the inward ends of the first group of leads facing and being spaced from the inward ends of the second group of leads; and wherein the first surface of the hexahedron is perpendicular to the second surface of the hexahedron, the third surface of the hexahedron parallels the first surface of the hexahedron, the inward ends disperse one by one between the first surface and the third surface (i.e., disperse one by one from the first edge of the polygon to the third edge of the polygon, or from the third edge of the polygon to the first edge of the polygon) in such a way that the further an arbitrary one of the inward ends is from the first surface of the hexahedron than another one of the inward ends, the nearer the arbitrary one of the inward ends is from the second surface of the hexahedron than the another one of the inward ends.

It can be seen the gap between any adjacent two of the inward ends of leads of either the first group or the second group in the lead frame according to the second aspect of the present invention can be significantly bigger than a corresponding gap (191 in FIG. 1) in a conventional lead frame of the same size scale, and the inner lead pitch of leads of either group according to the present invention can thus be significantly bigger. Again it is obvious the inner lead pitch of any two arbitrary leads of either group can be bigger than or at least equal to the gap between the inward ends of the two arbitrary leads.

If used in LOC packages, the inward ends of the first group of leads in the lead frame according to the second aspect of the present invention, similar to those in the lead frame according to the first aspect of the present invention, are spaced from the inward ends of the second group of leads by distances adequate for making electrical connection between the IC and the leads of the lead frame. For example, the bonding wires between the bonding pads of the IC and the leads of the lead frame must pass the space between the inward ends of the first group of leads and those of the second group of leads, therefore the distances between the inward ends of the first group of leads and those of the second group of leads are usually adequate for the bonding wires to be connected between the inward ends and of leads and the bonding pads of the IC. The distances between the inward ends of the first group of leads and those of the second group of leads, similar to those according to the first aspect of the present invention, may be uniform or vary with the locations of the inward ends, subject to the only condition that the space (not limited to two dimensions here) between the inward ends of the first group of leads and those of the second group of leads is adequate for electrically connecting therethrough the IC and the leads.

In the lead frame according to the second aspect of the present invention, the first group of leads may stretch to the outside of the lead frame in a first direction, and the second group of leads may stretch to the outside of the lead frame in a second direction different from or opposite to the first direction.

In the lead frame according to the second aspect of the present invention, the inward ends of the first group of leads may disperse along a first plane, and the inward ends of the second group of leads may disperse along a second plane either paralleling or not paralleling the first plane. However, in the lead frame according to the second aspect of the present invention, the inward ends of the first group of leads do not necessarily disperse along a plane, neither do the inward ends of the second group of leads necessarily disperse along a plane.

In the lead frame according to the second aspect of the present invention, any surface of the IC corresponding region may be a plane. For example, the first, the second, and the third surfaces as well as and the aforementioned "bottom surface" of the IC corresponding region are planes, wherein the aforementioned "bottom surface" may be perpendicular to the second surface and be a plane facing a bonding surface of an IC, with its size or pattern or shape equivalent to the bonding surface of an IC. The aforementioned "bottom surface" may even be the bonding surface of an IC.

A third aspect of the present invention may be represented by a lead frame for a process of packaging at least an IC, which comprises: a plurality of leads each including at least an outward end and an inward end; and an IC corresponding region (a region enclosed by a polygon such as a quadrilateral corresponding to the pattern of an IC, or equivalent to the size or shape of a bonding surface of an IC, for example); wherein the inward ends are inside the IC corresponding region, the first edge of the polygon is perpendicular to the second edge of the polygon, the third edge of the polygon parallels the first edge of the polygon, and the inward ends disperse one by one between the first edge and the third edge (i.e., disperse one by one from the first edge of the polygon to the third edge of the polygon, or from the third edge of the polygon to the first edge of the polygon) in such a way that the further an arbitrary one of the inward ends is from the first edge of the polygon than another one of the inward ends, the nearer the arbitrary one of the inward ends is from the second edge of the polygon than the another one of the inward ends.

According to the third aspect of the present invention, the difficulty to provide a lead frame with all leads thereof stretch in the same direction to the outside of the lead frame can be significantly eased. This is because the gap between any two adjacent inward ends of the leads according to the present invention can be significantly augmented under the condition the size of the lead frame and the number of leads of the lead frame remain the same. The inner lead pitch, as a result, can be significantly augmented for a lead frame with the same size and the same number of leads. All of the leads of the lead frame according to the third aspect of the present invention may stretch to the outside of the lead frame in the same direction without suffering the difficulty of dealing with smaller inner lead pitch, and without need of bigger size of lead frame. All of the leads of the lead frame according to the third aspect of the present invention may stretch to the outside of the lead frame in a direction perpendicular to the second edge of the polygon, for example.

It must be noted the IC corresponding region according to the third aspect of the present invention is not limited to a 2-dimensional space, and can be a 3-dimensional space enclosed by a hexahedron such as the one defined in the second aspect of the present invention, i.e., the inward ends of leads of the lead frame do not necessarily disperse along a line, nor do they necessarily disperse along a plane. Actually the lead frame according to the second aspect of the present invention may include one instead of two groups of leads, all the leads stretching to the outside of the leads frame in the same direction, the inward ends of the leads being configured in the same way as the third aspect of the present invention.

A fourth aspect of the present invention may be represented by a lead frame for a process of packaging at least an IC, which comprises: a plurality of leads each including at least an outward end and an inward end; and an IC corresponding region enclosed by a polygon (a quadrilateral, for example) including a first edge, a second edge, a third edge, and a fourth edge, the first edge paralleling the third edge, the second edge paralleling the fourth edge, the first edge and the second edge constituting an obtuse angle (an angle smaller than 180° while larger than 90°); wherein the leads are separated into two groups respectively having the inward ends thereof dispersing along the second edge and the fourth edge.

As can be understood from the first aspect of the present invention, the gap between any adjacent two inward ends of leads of each of the two groups in the lead frame according to the fourth aspect of the present invention can be significantly bigger than a corresponding gap (191 in FIG. 1) in a conventional lead frame of the same size scale, and the inner lead pitch of leads of each group according to the present invention can thus be significantly bigger.

Obviously the two groups of leads in the lead frame according to the fourth aspect of the present invention may respectively stretch to the outside of the lead frame in different or opposite directions.

The present invention may best be understood through the following description with reference to the accompanying drawings, in which:

DETAILED DESCRIPTION OF THE PREFERRED EMBODIMENTS

Figure 2:
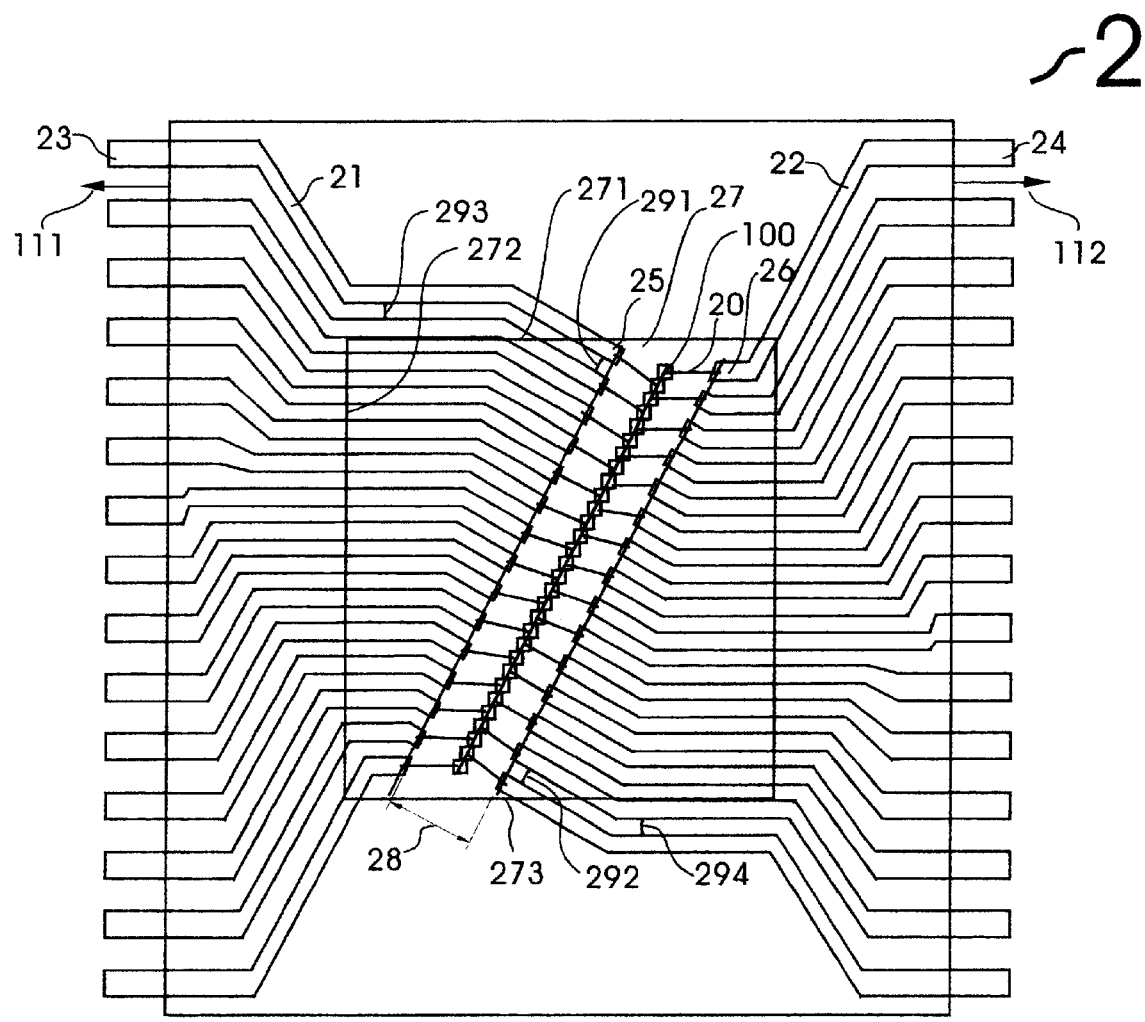
FIG. 2 shows a top view of a lead frame according to a first embodiment of the present invention.

As shown in FIG. 2 for its top view, a lead frame 2 according to a first embodiment of the present invention comprises: a first group of leads represented by 21; a second group of leads represented by 22; and an IC corresponding region enclosed by a polygon 27. The polygon 27 may be a quadrilateral corresponding to the pattern of an IC which is under the lead frame 2 and not shown in FIG. 2). For example, the polygon 27 may be a quadrilateral equivalent to the size or shape of a bonding surface of an IC, or may even be a bonding surface of an IC. Each lead, no matter it is in group 21 or 22, includes at least an outward end and an inward end, i.e., the first group of leads 21 include a first group of outward ends represented by 23 and a first group of inward ends represented by 25, and the second group of leads 22 include a second group of outward ends represented by 24 and a second group of inward end 26. All the inward ends 25 and 26 are inside the IC corresponding region, with inward ends 25 of the first group of leads 21 facing and being spaced from the inward ends 26 of the second group of leads 22 by a distance 28 or by various distances represented by 28. The first edge 271 of the polygon 27 is perpendicular to the second edge 272 of the polygon 27, the third edge 273 of the polygon 27 parallels the first edge 271 of the polygon 27. The inward ends, no matter they are the first group 25 or the second group 26, disperse one by one between the first edge 271 of the polygon 27 and the third edge 273 of the polygon 27 in such a way that the further an arbitrary one of the inward ends in a group (either group 25 or 26) is from the first edge 271 of the polygon 27 than another one of the inward ends in the group, the nearer the arbitrary one of the inward ends is from the second edge 272 of the polygon 27 than the another one of the inward ends. In other words, the inward ends 25 disperse, one by one from the first edge 271 of the polygon 27 to the third edge 273 of the polygon 27 or from the third edge 273 of the polygon 27 to the first edge 271 of the polygon 27, in such a way that the further an arbitrary one of the inward ends 25 is from the first edge 271 of the polygon 27 than another one of the inward ends 25, the nearer the arbitrary one of the inward ends 25 is from the second edge 272 of the polygon 27 than the another one of the inward ends 25. The pitch of inward ends 25, i.e., the gap between adjacent two of inward ends 25, may be uniform or not uniform. Similarly, the inward ends 26 disperse, one by one from the first edge 271 of the inwards polygon 27 to the third edge 273 of the polygon 27 or from the third edge 273 of the polygon 27 to the first edge 271 of the polygon 27, in such a way that the further an arbitrary one of the inward ends 26 is from the first edge 271 of the polygon 27 than another one of the inward ends 26, the nearer the arbitrary one of the inward ends 26 is from the second edge 272 of the polygon 27 than the another one of the inward ends 26. The pitch of inward ends 26, i.e., the gap between adjacent two of inward ends 26, may be uniform or not uniform.

Figure 1:
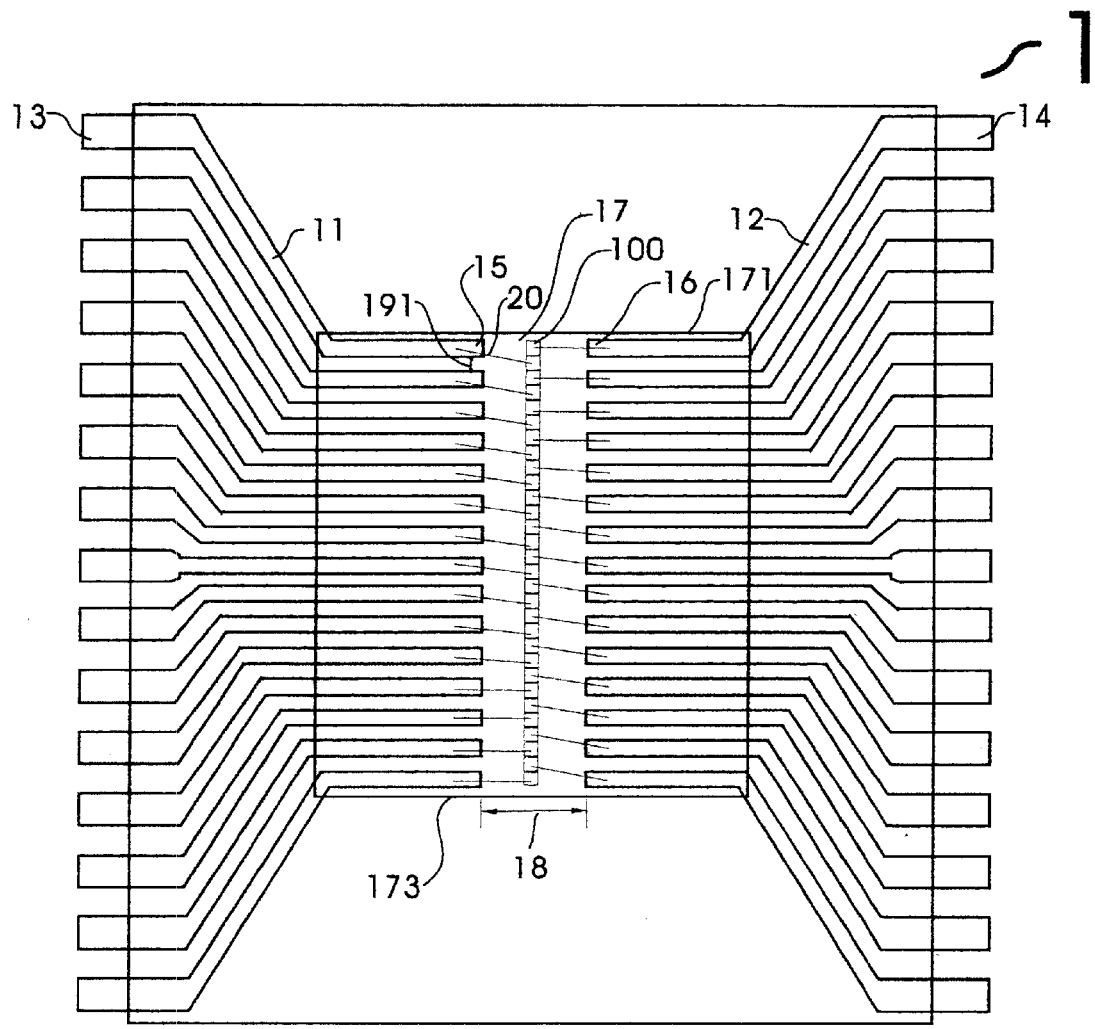
FIG. 1 shows a top view of a lead frame for a process of packaging an IC in LOC configuration.

It can be seen the gap 291 or 292 between any adjacent two of the inward ends for each group (25 or 26) in the lead frame 2 of FIG. 2 according to the present invention can be significantly bigger than a corresponding gap (191 in FIG. 1) in a conventional lead frame (1 in FIG. 1) of the same size scale, and the inner lead pitch 293 or 294 of leads (group 21 or 22) according to the present invention can thus be significantly bigger, because the inner lead pitch 293 or 294 of any two arbitrary leads (group 21 or 22) can be bigger than or at least equal to the gap 291 or 292 between the inward ends of the two arbitrary leads.

If used in LOC packages, the inward ends 25 of the first group of leads 21 in the lead frame 2 of FIG. 2 are spaced from the inward ends 26 of the second group of leads 22 by distances (represented by 28 in FIG. 2, but not necessarily uniform) which are adequate for making electrical connection between the IC and the leads (both groups 21 and 22) of the lead frame 2. For example, the bonding wires 20 connecting the bonding pad 100 of an IC to the inward ends 25 or 26 must pass the space between the inward ends 25 (or 26) of the first (or second) group of leads 21 (or 22) and the bonding pads 100 of the IC, therefore the distances 28 between the inward ends 25 and inward ends 26 are usually adequate for the bonding wires 20 to be connected between the inward ends 25 (or 26) and the bonding pads 100 of the IC. The distances 28 between the inward ends of the first group of leads 21 and those of the second group of leads 22 may be uniform or vary with the locations of the inward ends, subject to the only condition that the space between the inward ends of the first group of leads 21 and those of the second group of leads 22 is adequate for electrically connecting therethrough the IC (or bonding pads 100 of the IC) and the leads. One way to design the distances 28 is to keep it always in a specified distance range which has proved satisfactory according to experience or experiments.

In the lead frame 2 according to the first embodiment of the present invention shown in FIG. 2, the space between any adjacent inward ends 25 of the first group of leads 21 and the space between any adjacent inward ends 26 of the second group of leads 22 are in a specified gap range which has proved satisfactory in view of lowering failure rate, minimizing cost, simplifying manufacturing process, or any relevant factors.

In the lead frame 2 according to the first embodiment of the present invention shown in FIG. 2, the first group of leads 21 may stretch to the outside of the lead frame 2 in a first direction 111, and the second group of leads 22 may stretch to the outside of the lead frame 2 in a second direction 112 different from or opposite to the first direction 111. For example, the first direction 111 and/or the second direction 112 may be perpendicular to the second edge 272 of the polygon 27.

In the lead frame 2 according to the first embodiment of the present invention shown in FIG. 2, the inward ends 25 of the first group of leads 21 may disperse along a first straight line (numeral reference not shown), and the inward ends 26 of the second group of leads 22 may disperse along a second straight line (numeral reference not shown) either paralleling or not paralleling the first straight line. However, in the lead frame 2 according to the first embodiment of the present invention shown in FIG. 2, the inward ends 25 of the first group of leads 21 do not necessarily disperse along a straight line, neither do the inward ends 26 of the second group of leads 22 necessarily disperse along a straight line.

Figure 3:
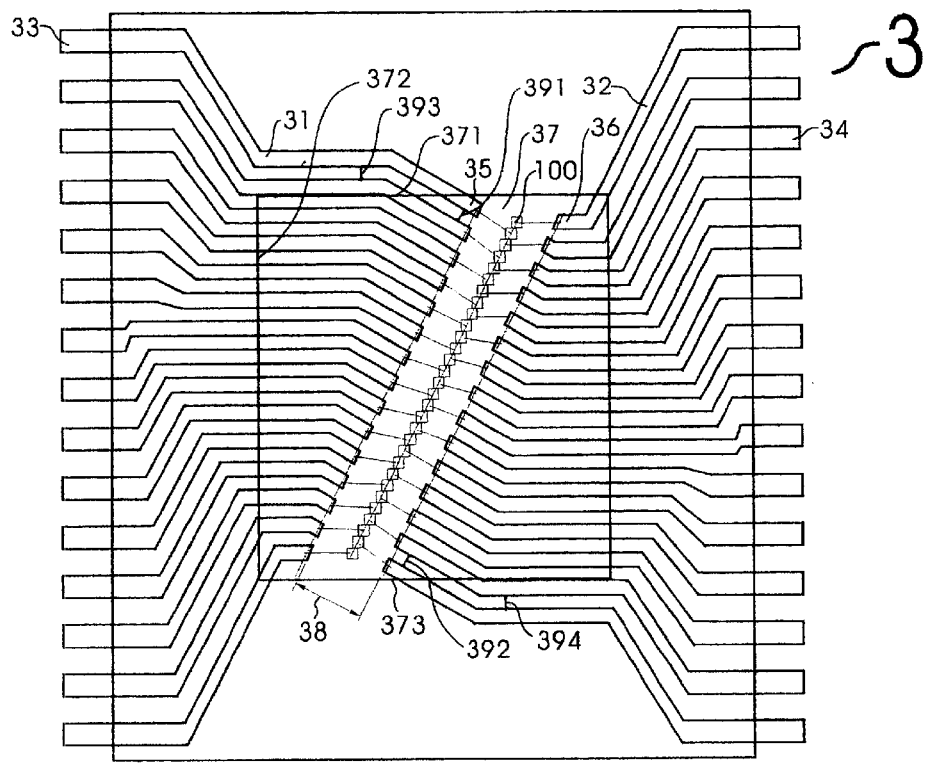
FIG. 3 shows a top view of a lead frame according to a second embodiment of the present invention.

As shown in FIG. 3 for its top view, a lead frame 3 according to a second embodiment of the present invention comprises: a first group of leads represented by 31; a second group of leads represented by 32; and an IC corresponding region enclosed by a polyhedron 37 (3 dimensions, with only top view shown in FIG. 3). The IC corresponding region may be a space enclosed by the polyhedron 37 which includes a first surface represented by a top view edge 371, a second surface represented by a top view edge 372, a third surface represented by a top view edge 373, and a certain surface (not shown in FIG. 3) corresponding to a bonding surface of an IC that is under the lead frame 3 and not shown in FIG. 3. For example, the IC corresponding region is a space enclosed by polyhedron 37 having a certain surface equivalent to the size or shape of a bonding surface of an IC, or being a bonding surface of an IC. Each lead, no matter it is in group 31 or 32, includes at least an outward end and an inward end, i.e., the first group of leads 31 include a first group of outward ends represented by 33 and a first group of inward ends represented by 35, and the second group of leads 32 include a second group of outward ends represented by 34 and a second group of inward end 36. All the inward ends 35 and 36 are inside the IC corresponding region, with inward ends 35 of the first group of leads 31 facing and being spaced from the inward ends 36 of the second group of leads 32 by a distance 38 or by various distances represented by 38. The first surface represented by top view edge 371 is perpendicular to the second surface represented by top view edge 372, the third surface represented by top view edge 373 parallels the first surface represented by top view edge 371. The inward ends, no matter they are the first group 35 or the second group 36, disperse one by one between the first surface represented by top view edge 371 and the third surface represented by top view edge 373, in such a way that the further an arbitrary one of the inward ends in a group (either group 35 or 36) is from the first surface represented by top view edge 371 than another one of the inward ends in the group, the nearer the arbitrary one of the inward ends is from the second surface represented by top view edge 372 than the another one of the inward ends. In other words, the inward ends 35 disperse, one by one from the first surface represented by top view edge 371 to the third surface represented by top view edge 373 or from the third surface represented by top view edge 373 to the first surface represented by top view edge 371, in such a way that the further an arbitrary one of the inward ends 35 is from the first surface represented by top view edge 371 than another one of the inward ends 35, the nearer the arbitrary one of the inward ends 35 is from the second surface represented by top view edge 372 than the another one of the inward ends 35. Similarly, the inward ends 36 disperse, one by one from the first surface represented by top view edge 371 to the third surface represented by top view edge 373 or from the third surface represented by top view edge 373 to the first surface represented by top view edge 371, in such a way that the further an arbitrary one of the inward ends 36 is from the first surface represented by top view edge 371 than another one of the inward ends 36, the nearer the arbitrary one of the inward ends 36 is from the second surface represented by top view edge 372 than the another one of the inward ends 36. The pitch of inward ends 35, i.e., the gap between adjacent two of inward ends 35, may be uniform or not uniform, and the pitch of inward ends 36, i.e., the gap between adjacent two of inward ends 36, may be uniform or not uniform.

It can be seen the gap 391 or 392 between any adjacent two of the inward ends for each group (35 or 36) in the lead frame 3 of FIG. 3 according to the present invention can be significantly bigger than a corresponding gap (191 in FIG. 1) in a conventional lead frame (1 in FIG. 1) of the same size scale, and the inner lead pitch 393 or 394 of leads (group 31 or 32) according to the present invention can thus be significantly bigger, because the inner lead pitch 393 or 394 of any two arbitrary leads group 31 or 32) can be bigger than or at least equal to the gap 391 or 392 between the inward ends of the two arbitrary leads.

If used in LOC packages, the inward ends 35 of the first group of leads 31 in the lead frame 3 of FIG. 3 are spaced from the inward ends 36 of the second group of leads 32 by distances (represented by 38 in FIG. 3, but not necessarily uniform) which are adequate for making electrical connection between the IC and the leads (both groups 31 and 32) of the lead frame 3. For example, the bonding wires (not shown in FIG. 3) connecting the bonding pad 100 of an IC to the inward ends 35 or 36 must pass the space between the inward ends 35 (or 36) of the first (or second) group of leads 31 (or 32) and the bonding pads 100 of the IC, therefore the distances 38 between the inward ends 35 and inward ends 36 are usually adequate for the bonding wires to be connected between the inward ends 35 (or 36) and the bonding pads 100 of the IC. The distances 38 between the inward ends of the first group of leads 31 and those of the second group of leads 32 may be uniform or vary with the locations of the inward ends, subject to the only condition that the space between the inward ends 35 of the first group of leads 31 and those (36) of the second group of leads 32 is adequate for electrically connecting therethrough the IC (or bonding pads 100 of the IC) and the leads. One way to design the distances 38 is to keep it always in a specified distance range which has proved satisfactory according to experience or experiments.

In the lead frame 3 according to the second embodiment of the present invention shown in FIG. 3, the space (gap 391) between any adjacent inward ends 35 of the first group of leads 31 and the space (gap 392) between any adjacent inward ends 36 of the second group of leads 32 are in a specified gap range which has proved satisfactory in view of lowering failure rate, minimizing cost, simplifying manufacturing process, or any relevant factors.

In the lead frame 3 according to the second embodiment of the present invention shown in FIG. 3, the first group of leads 31 may stretch to the outside of the lead frame 3 in a first direction, and the second group of leads 32 may stretch to the outside of the lead frame 3 in a second direction different from or opposite to the first direction. For example, the first direction and/or the second direction may be perpendicular to the second surface represented by top view edge 372.

In the lead frame 3 according to the second embodiment of the present invention shown in FIG. 3, the inward ends 35 of the first group of leads 31 may disperse along a first plane (numeral reference not shown), and the inward ends 36 of the second group of leads 32 may disperse along a second plane (numeral reference not shown) either paralleling or not paralleling the first plane. However, in the lead frame 3 according to the second embodiment of the present invention shown in FIG. 3, the inward ends 35 of the first group of leads 31 do not necessarily disperse along a plane, and neither do the inward ends 36 of the second group of leads 32 necessarily disperse along a plane.

Figure 4:
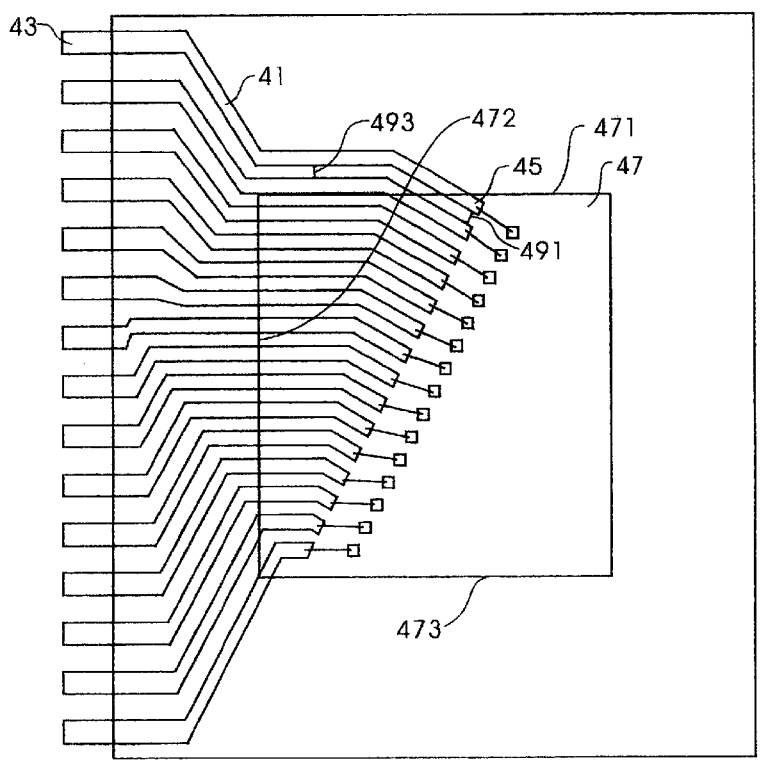
FIG. 4 shows a top view of a lead frame according to a third embodiment of the-present invention.

As shown in FIG. 4 for its top view, a lead frame 4 according to a third embodiment of the present invention comprises: a plurality of leads represented by 41; and an IC corresponding region 47 of 2 dimensions or 3 dimensions. The IC corresponding region 47, for example, may be a 2-dimensional space enclosed by a polygon such as a quadrilateral corresponding to the pattern of an IC (an IC under the lead frame 4 and not shown in FIG. 4), or a quadrilateral equivalent to the size or shape of a bonding surface of an IC, or a quadrilateral being a bonding surface of an IC. To simplify descriptions, FIG. 4 is illustrated as follows by an arbitrary example with the IC corresponding region 47 enclosed by a quadrilateral. Each lead 41 includes at least an outward end represented by 43 and an inward end represented by 45. All the inward ends 45 are inside the IC corresponding region 47. The first edge 471 of the IC corresponding region 47 is perpendicular to the second edge 472 of the IC corresponding region 47, the third edge 473 of the IC corresponding region 47 parallels the first edge 471 of the IC corresponding region 47. The inward ends 45 disperse one by one between the first edge 471 of the IC corresponding region 47 and the third edge 473 of the IC corresponding region 47 in such a way that the further an arbitrary one of the inward ends 45 is from the first edge 471 of the IC corresponding region 47 than another one of the inward ends 45, the nearer the arbitrary one of the inward ends 45 is from the second edge 472 of the IC corresponding region 47 than the another one of the inward ends 45. In other words, the inward ends 45 disperse, one by one from the first edge 471 of the IC corresponding region 47 to the third edge 473 of the IC corresponding region 47 or from the third edge 473 of the IC corresponding region 47 to the first edge 471 of the IC corresponding region 47, in such a way that the further an arbitrary one of the inward ends 45 is from the first edge 471 of the IC corresponding region 47 than another one of the inward ends 45, the nearer the arbitrary one of the inward ends 45 is from the second edge 472 of the IC corresponding region 47 than the another one of the inward ends 45. The pitch of inward ends 45, i.e., the gap between adjacent two of inward ends 45, may be uniform or not uniform.

According to the third embodiment of the present invention, the difficulty to provide a lead frame 4 with all leads 41 thereof stretch in the same direction to the outside of the lead frame 4 can be significantly eased. This is because the gap 491 between any two adjacent ones of inward ends 45 according to the present invention can be significantly augmented under the condition the size of the lead frame and the number of leads of the lead frame remain the same, the inner lead pitch 493, as a result, can be significantly augmented for a lead frame with the same size and the same number of leads. All of the leads 41 of the lead frame 4 according to the third embodiment of the present invention shown in FIG. 4 may stretch to the outside of the lead frame 4 in a direction perpendicular, for example, to the second edge 472 of the IC corresponding region.

It is obvious the IC corresponding region 47 according to the third embodiment of the present invention shown in FIG. 4 can also be a 3-dimensional space enclosed by a hexahedron as defined in the second aspect of the present invention, i.e., the inward ends 45 of leads 41 of the lead frame 4 do not necessarily disperse along a line, nor do they necessarily disperse along a plane. Actually the lead frame 3 according to the second embodiment of the present invention shown in FIG. 3 may include one group (31 or 32) instead of two groups (31 and 32) of leads, with the only one group (31 or 32) of leads thereof stretching to the outside of lead frame 3 in the same direction, and with the only one group (35 or 36) of inward ends thereof being configured in the same way as the third embodiment of the present invention shown in FIG. 4.

Figure 5:
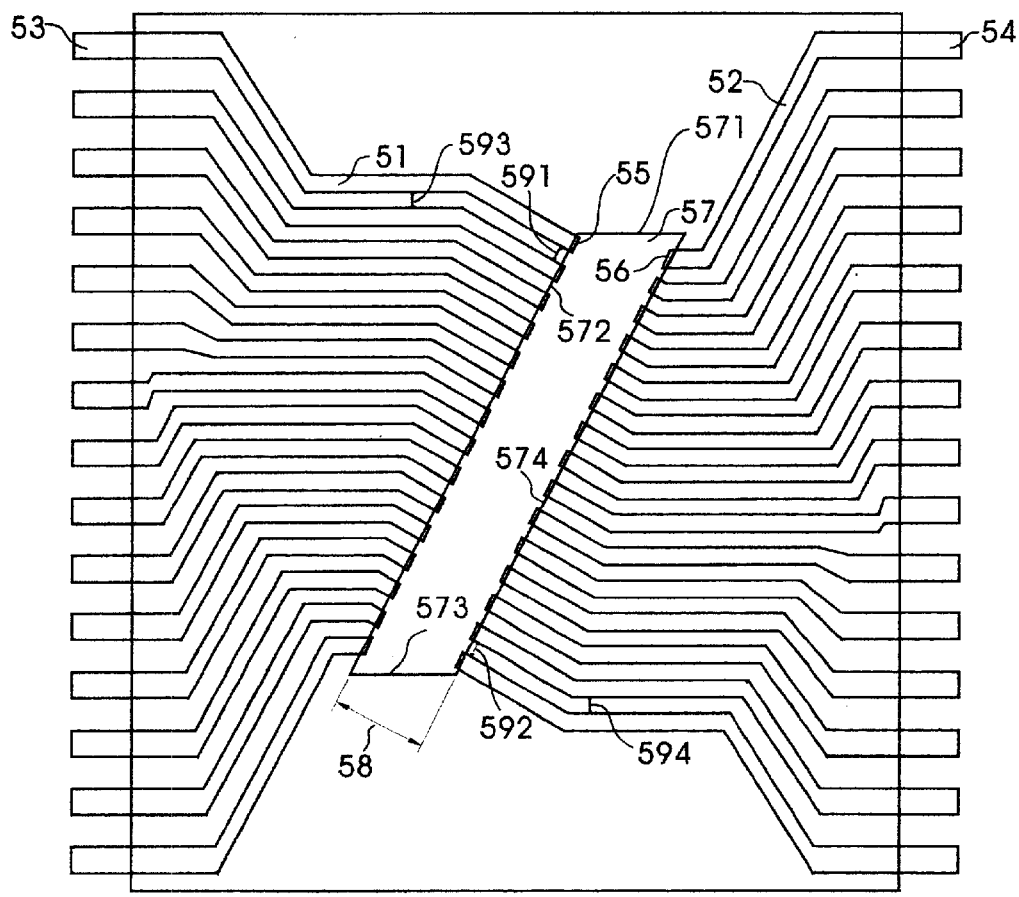
FIG. 5 shows a top view of a lead frame according to a fourth embodiment of the present invention.

As shown in FIG. 5 for its top view, a lead frame 5 according to a fourth embodiment of the present invention comprises: a plurality of leads represented by 51 and 52 each including at least an outward end (represented by 53 and 54) and an inward end (represented by 55 and 56); and an IC corresponding region enclosed by a polygon 57 (a quadrilateral, for example) including a first edge 571, a second edge 572, a third edge 573, and a fourth edge 574, the first edge 571 paralleling the third edge 573, the second edge 572 paralleling the fourth edge 574, the first edge 571 and the second edge 572 constituting an obtuse angle (an angle smaller than 180° while larger than 90°); wherein the leads are separated into two groups (represented by 51 and 52) respectively having the inward ends (represented by 55 and 56) thereof dispersing along the second edge 572 and the fourth edge 574. The pitch of inward ends 55, i.e., the gap between adjacent two of inward ends 55, may be uniform or not uniform, and the pitch of inward ends 56, i.e., the gap between adjacent two of inward ends 56, may be uniform or not uniform.

The gap 591 or 592 between any adjacent two of inward ends 55 or 56 of leads 51 or 52 in the lead frame 5 according to the fourth embodiment of the present invention can be significantly bigger than a corresponding gap (191 in FIG. 1) in a conventional lead frame of the same size scale, and the inner lead pitch 593 or 594 of leads 51 or 52 according to the present invention can thus be significantly bigger.

Obviously the two groups of leads 51 and 52 in the lead frame 5 according to the fourth aspect of the present invention may respectively stretch to the outside of the lead frame 5 in different or opposite directions.

While the invention has been described in terms of what are presently considered to be the most practical or preferred embodiments, it shall be understood that the invention is not limited to the disclosed embodiment. The spirit and scope of the invention shall cover any modifications or similar arrangements.

What is claimed is:

1. A lead frame for a process of packaging at least an IC, comprising:
    a first group of leads;
    a second group of leads; and
    an IC corresponding region enclosed by a polygon including a first edge, a second edge, and a third edge;
    wherein said lead includes at least an outward end and an inward end, the inward end being inside said IC corresponding region, the inward ends of said first group of leads facing and being spaced from the inward ends of said second group of leads; and wherein said first edge is perpendicular to said second edge, said third edge parallels said first edge, said inward ends disperse one by one between said first edge and said third edge in such a way that the further an arbitrary said inward end is from said first edge than another said inward end, the nearer the arbitrary said inward end is from said second edge than the another said inward end.

2. The lead frame according to claim 1 wherein said first group of leads stretch to the outside of said lead frame in a first direction, and said second group of leads stretch to the outside of said lead frame in a second direction different from said first direction.

3. The lead frame according to claim 1 wherein said first group of leads stretch to the outside of said lead frame in a first direction, and said second group of leads stretch to the outside of said lead frame in a second direction opposite to said first direction.

4. The lead frame according to claim 1 wherein the inward ends of said first group of leads disperse along a first straight line, and the inward ends of said second group of leads disperse along a second straight line.

5. The lead frame according to claim 1 wherein the inward ends of said first group of leads disperse along a first straight line, and the inward ends of said second group of leads disperse along a second straight line, said second straight line paralleling said first straight line.

6. The lead frame according to claim 1 wherein the inward ends of said first group of leads are spaced from the inward ends of said second group of leads by a distance varying with the location of said inward ends.

7. The lead frame according to claim 1 wherein the inward ends of said first group of leads are spaced from the inward ends of said second group of leads by a uniform distance.

8. The lead frame according to claim 1 wherein the inward ends of said first group of leads are spaced from the inward ends of said second group of leads by distances which are in a specified distance range.

9. The lead frame according to claim 1 wherein the space between any adjacent said inward ends of said first group of leads and the space between any adjacent said inward ends of said second group of leads are in a specified gap range.

10. The lead frame according to claim 1 wherein said IC corresponding region is a plane matching the pattern of a bonding surface of said IC.

11. The lead frame according to claim 1 wherein said IC corresponding region is a plane equivalent to a bonding surface of said IC.

12. A lead frame for a process of packaging at least an IC, comprising:
    a first group of leads;
    a second group of leads; and
    an IC corresponding region enclosed by a polyhedron including a first surface, a second surface, and a third surface;
    wherein said lead includes at least an outward end and an inward end, the inward ends being inside said IC corresponding region, the inward ends of said first group of leads facing and being spaced from the inward ends of said second group of leads; and wherein said first surface is perpendicular to said second surface, said third surface parallels said first surface, said inward ends disperse one by one between said first surface and said third surface in such a way that the further an arbitrary said inward end is from said first surface than another said inward end, the nearer the arbitrary said inward end is from said second surface than the another said inward end.

13. The lead frame according to claim 12 wherein said first group of leads stretch to the outside of said lead frame in a first direction, and said second group of leads stretch to the outside of said lead frame in a second direction different from said first direction.

14. The lead frame according to claim 12 wherein said first group of leads stretch to the outside of said lead frame in a first direction, and said second group of leads stretch to the outside of said lead frame in a second direction opposite to said first direction.

15. The lead frame according to claim 12 wherein the inward ends of said first group of leads disperse along a first plane, and the inward ends of said second group of leads disperse along a second plane.

16. The lead frame according to claim 12 wherein the inward ends of said first group of leads disperse along a first plane, and the inward ends of said second group of leads disperse along a second plane, said second plane paralleling said first plane.

17. The lead frame according to claim 12 wherein the inward ends of said first group of leads are spaced from the inward ends of said second group of leads by a distance varying with the location of said inward ends.

18. The lead frame according to claim 12 wherein the inward ends of said first group of leads are spaced from the inward ends of said second group of leads by a uniform distance.

19. The lead frame according to claim 12 wherein the inward ends of said first group of leads are spaced from the inward ends of said second group of leads by a distance which is in a specified distance range.

20. The lead frame according to claim 12 wherein the space between any adjacent said inward ends of said first group of leads and the space between any adjacent said inward ends of said second group of leads are in a specified gap range.

21. The lead frame according to claim 12 wherein said IC corresponding region is a region having a surface matching the pattern of a bonding surface of said IC.

22. The lead frame according to claim 12 wherein said IC corresponding region is a region having a surface equivalent to a bonding surface of said IC.

23. A lead frame for a process of packaging at least an IC, comprising:
   a plurality of leads each including at least an outward end and an inward end; and
   an IC corresponding region enclosed by a polygon including a first edge, a second edge, and a third edge;
   wherein said inward ends are inside said IC corresponding region, said first edge is perpendicular to said second edge, said third edge parallels said first edge, said inward ends dispersing one by one between said first edge and said third edge in such a way that the further an arbitrary said inward end is from said first edge than another said inward end, the nearer the arbitrary said inward end is from said second edge than the another said inward end.

24. The lead frame according to claim 23 wherein said leads stretch to the outside of said lead frame in a direction perpendicular to said second edge.

25. The lead frame according to claim 23 wherein said leads stretch to the outside of said lead frame in a direction perpendicular to said second edge.

26. The lead frame according to claim 23 wherein said leads are separated into two groups respectively having said inward ends thereof dispersing between said first edge and said third edge, and respectively stretching to the outside of said lead frame in opposite directions both perpendicular to said second edge.

27. The lead frame according to claim 23 wherein said IC corresponding region is enclosed by a polygon equivalent to a bonding surface of the IC.

28. A lead frame for a process of packaging at least an IC, comprising:
   a plurality of leads each including at least an outward end and an inward end; and
   an IC corresponding region enclosed by a polyhedron including a first surface, a second surface, and a third surface;
   wherein said inward ends are inside said IC corresponding region, said first surface is perpendicular to said second surface, said third surface parallels said first surface, said inward ends dispersing one by one between said first surface and said third surface in such a way that the further an arbitrary said inward end is from said first surface than another said inward end, the nearer the arbitrary said inward end is from said second surface than the another said inward end.

29. The lead frame according to claim 28 wherein said IC corresponding region is enclosed by a polyhedron having a surface equivalent to a bonding surface of the IC.

30. A lead frame for a process of packaging at least an IC, comprising:
   a plurality of leads each including at least an outward end and an inward end; and
   an IC corresponding region enclosed by a polygon including a first edge, a second edge, a third edge, and a fourth edge, said first edge paralleling said third edge, said second edge paralleling said fourth edge, said first edge and said second edge constituting an obtuse angle;
   wherein said leads are separated into two groups respectively having said inward ends thereof dispersing along said second edge and said fourth edge.

31. The lead frame according to claim 30 wherein said two groups respectively stretch to the outside of said lead frame in different directions.

32. The lead frame according to claim 30 wherein said two groups respectively stretch to the outside of said lead frame in opposite directions.

33. The lead frame according to claim 30 wherein said IC corresponding region is enclosed by a polygon equivalent to a bonding surface of the IC.

* * * * *